(12) United States Patent
Diamantidis

(10) Patent No.: US 7,851,815 B2
(45) Date of Patent: Dec. 14, 2010

(54) LIGHT-EMITTING ELEMENT HAVING AT LEAST ONE LIGHT-EMITTING CHIP CRYSTAL

(75) Inventor: Georg Diamantidis, Dernbach (DE)

(73) Assignee: Noctron Holding S.A., Bridel (LU)

( * ) Notice: Subject to any disclaimer, the term of this patent is extended or adjusted under 35 U.S.C. 154(b) by 226 days.

(21) Appl. No.: 11/584,350

(22) Filed: Oct. 20, 2006

(65) Prior Publication Data

US 2007/0090391 A1    Apr. 26, 2007

(30) Foreign Application Priority Data

Oct. 22, 2005    (DE) .................. 10 2005 050 947

(51) Int. Cl.
 *H01L 33/00*    (2010.01)
(52) U.S. Cl. ................... 257/98; 257/99; 257/712; 257/E33.075; 257/E31.131; 257/E23.08; 257/E23.088; 257/E23.082; 257/E23.102
(58) Field of Classification Search .............. 257/81, 257/84, 85, 88, 97, 100, 687, 714, 721, 98, 257/99, 712, E33.075, E31.131, E23.08, 257/E23.082, E23.088, E23.102; 313/22, 313/24, 35, 484, 538, 567, 573
See application file for complete search history.

(56) References Cited

U.S. PATENT DOCUMENTS 4,357,557 A * 11/1982 Inohara et al. ............... 313/509

| | | | |
|---|---|---|---|
| 6,480,389 B1 | 11/2002 | Shie et al. | |
| 2002/0149312 A1 | 10/2002 | Roberts et al. | |
| 2004/0004435 A1 | 1/2004 | Hsu | |
| 2004/0046178 A1 | 3/2004 | Sano | |
| 2004/0264192 A1* | 12/2004 | Nagata et al. ................ | 362/267 |
| 2005/0178151 A1* | 8/2005 | Matsumoto et al. ........... | 62/513 |

FOREIGN PATENT DOCUMENTS

| | | |
|---|---|---|
| DE | 3010164 A1 | 9/1980 |
| DE | 20219869 U1 | 5/2003 |
| EP | 0658933 A2 | 6/1995 |
| EP | 1475846 A2 | 11/2004 |
| JP | 11163410 A | 6/1999 |
| JP | 2001036148 A | 2/2001 |
| JP | 2001036153 A | 2/2001 |
| JP | 2005079149 A | 3/2005 |

OTHER PUBLICATIONS

Machine Translation of JP 2001-036148.*
Human Translation of JP 2001-036148.*
German Patent Office, Office Action in German Application No. 10 2005 050 947.9-33 dated Jul. 6, 2007.
European Patent Office, EPO Search Report in European Application No. 06017503.1-2222 dated Dec. 19, 2006.

* cited by examiner

*Primary Examiner*—David Vu
*Assistant Examiner*—Suberr Chi
(74) *Attorney, Agent, or Firm*—Factor & Lake, Ltd.

(57) ABSTRACT

A light-emitting element, in particular a light-emitting diode, having at least one light-emitting chip crystal, in particular a semiconductor crystal, is described. At least free surfaces of the light-emitting chip crystal are covered with an inert material—liquid fluid—which is in direct contact with the light-emitting chip crystal.

30 Claims, 7 Drawing Sheets

LIGHT-EMITTING ELEMENT HAVING AT LEAST ONE LIGHT-EMITTING CHIP CRYSTAL

RELATED APPLICATIONS

The present invention claims the benefit of the filing date of German Patent Application, Ser. No. 10 2005 050 947.9, filed Oct. 22, 2005; the content of which is incorporated by reference herein.

TECHNICAL FIELD

The invention relates to a light-emitting element, in particular a light-emitting element similar to a light-emitting diode, having at least one light-emitting chip crystal, in particular a semiconductor crystal, wherein at least one free surface of the light-emitting chip crystal is covered with an inert material.

BACKGROUND OF THE INVENTION

Known light-emitting elements, in particular light-emitting diodes, comprise light-emitting chip crystals of semiconductor structures, with which light is emitted in a characteristic wavelength for the semiconductor structures or a characteristic wavelength range.

The light-emitting chip crystals are arranged on substrates and are cast in a transparent resin together with these. The light-emitting chip crystals are insulated and protected thermally, electrically and mechanically from the environment, in particular against the ambient air, by the transparent resin.

In order to excite known light-emitting elements, the light-emitting chip crystals are charged with a supply voltage via appropriate connections. As a result, the light-emitting chip crystals heat up. In the case of known light-emitting elements, the supply voltage and therefore the emission output are limited in particular by the heat resistance of the transparent resin. If the light-emitting elements are operated above a supply voltage which is typical for them, the transparent resin melts due to the heating up of the light-emitting chip crystals, discolours in particular with the formation of air bubbles and "dies".

The present invention is directed to resolving these and other matters.

SUMMARY OF THE INVENTION

According to one aspect of the present invention, a fluid surrounds the light-emitting chip crystal, insulates it in this way mechanically, chemically, and/or electrically from air and the environment and removes the heat which arises. By the fact that the fluid is in direct contact, which in particular is free from air or gas bubbles, with the light-emitting chip crystal, the heat which arises when the light-emitting chip crystal is charged with the supply voltage is transferred to the fluid and transported away with this, so that the light-emitting chip crystal is cooled.

As a result, premature overheating of the fluid is also prevented, so that this also does not change optically in particular and in the worst case "die." In this manner, the light-emitting chip crystal can be operated at a significantly higher supply voltage than is possible when transparent resin is used.

Cooling of the light-emitting chip crystal furthermore has the effect of a significant improvement in its efficiency in respect of emission. Overall, an increase in the emission output is thus achieved due to a higher maximum supply voltage and/or the improvement in the efficiency, even at a low supply voltage.

In another aspect of the present invention, the liquid fluid can be transparent at least to the light of the wavelength range emitted by the light-emitting chip crystal, so that the light generated by the light-emitting chip crystal can be emitted unimpeded through the fluid into the environment.

In order to prevent in particular leakage currents and/or reactions of the light-emitting chip crystal in particular with the ambient air, the liquid fluid should be a good voltage and air insulator.

The liquid fluid can expediently be viscous. In viscous fluid, the light-emitting chip crystal can be embedded particularly well and is protected against mechanical influences, in particular vibrations.

So that on heating up the liquid fluid also adapts its shape to the surface of the light-emitting chip crystal in an optimum manner, and covers this without gaps, the liquid fluid should also retain its viscosity at higher temperatures. Furthermore, this has the advantage that due to the constant viscosity of the liquid fluid, which is largely independent of temperature, the light-emitting chip crystal is also protected against vibrations in the radiantly activated light-emitting chip, which then heats up severely in particular in the region of the light-emitting chip crystal.

In order to ensure a particularly good transportation of heat away from the light-emitting chip crystal to the environment and therefore to prevent overheating of the light-emitting chip crystal and/or of the fluid, the liquid fluid should be a good heat conductor.

In yet another aspect of the present invention, the liquid fluid can be charged with a pressure, wherein air bubbles are prevented from forming on the hot surface of the light-emitting chip crystal in this manner. For example, air bubbles on the surface of a sapphire crystal, as the substrate, coated with InGaN as the light-emitting chip crystal lead to immediate burning of the light-emitting chip crystal. This is destroyed in a fraction of a second and thus no longer generates light.

A still further aspect of the present invention includes, the liquid fluid being silicone oil. Silicone oil has all the required properties of the liquid fluid according to the present invention. It is moreover easy to prepare industrially and easy to process.

In order to be able to generate blue light in the wavelength range of from 460 nm to 480 nm with the light-emitting chip, the light-emitting chip crystal can be a structure of InGaN/GaN.

The liquid fluid can furthermore contain media which influence the wavelength emitted or the wavelength range, in particular dyestuffs, or phosphorus crystals. For example, by addition of crystals which are active at wavelengths of from 450 nm to 480 nm and convert blue into white or yellow-white or red or green light, white light can be emitted from the light-emitting chip which has a blue-emitting light-emitting chip crystal.

In order to be able to generate light in the infra-red, in particular in the near infra-red range, preferably having a wavelength of about 850 nm, with the light-emitting chip, the light-emitting chip crystal can be a structure of crystals which emit infra-red radiation.

The light-emitting chip crystal can be arranged on a substrate, in particular sapphire or diamond. Substrates of sapphire or diamond are easy to realize industrially. With substrates of diamond, it is also possible to realize smaller light-emitting chip crystals having dimensions of, in particular, 300 μm×300 μm, with which a high temperature and a higher efficiency can be realized.

The light-emitting element can comprise a support, in particular a metal or ceramic support, for the light-emitting chip crystal or the substrate. The light-emitting chip crystal or the substrate is fixed to the support in a stable manner.

The support, in particular the metal support comprising a plate, can act as a reflector for the light emitted by the light-emitting chip crystal. In this manner, no separate reflector is necessary in order in particular to reflect the light emitted in the backwards direction into the desired emission direction of the light-emitting element.

In order to refract, in particular to bundle, the light generated by the light-emitting chip crystal without separate optical components, the liquid fluid can be arranged relatively to the light-emitting chip crystal such that it has the effect of an optical system, in particular a lens, for the light emitted by the light-emitting chip crystal.

Furthermore, at least the light-emitting chip crystal can be covered by an optical lens, in particular a glass lens, and at least the region between the light-emitting chip crystal and the lens can be filled with the liquid fluid. In this manner, the refraction of the light generated by the light-emitting chip crystal is improved significantly. The lens can also serve as a housing for the light-emitting chip crystals and the region between the lens and the light-emitting chip crystals can be filled with the liquid fluid, so that no separate housing is necessary.

The light-emitting chip crystal can expediently have surface dimensions of between 350 μm×350 μm and 1,050 μm×1,050 μm. At this size the light-emitting element has an optimum efficiency in respect of the emission of light.

In order to achieve an increase in the size of the emitting surface and therefore an increase in the emission output with small structural widths each having an optimum efficiency in respect of the emission of light, the light-emitting element can comprise in particular a hybrid structure of a plurality of light-emitting chip crystals which are arranged in particular in chains and can be connected in series or in parallel. A large number of chains, which are each composed of a plurality of light-emitting chip crystals connected in series, can be connected in parallel. The light-emitting chip crystals of the hybrid structure can have different structural widths.

So that the liquid fluid does not flow away from the light-emitting chip crystal and moreover the light-emitting element is stable and protected on the outside, the light-emitting chip crystal can be arranged in a housing which is transparent in particular to light of the wavelength range emitted by the light-emitting chip crystal, in particular a housing of glass or plastic, and which is filled with the liquid fluid. Due to the container which is transparent to light of the corresponding wavelengths, the radiation can be emitted virtually undamped into the environment.

The housing can have a means for filling with the liquid fluid, so that it can also be filled easily with the fluid after installation of the light-emitting chip crystal.

In a still further aspect of the present invention, the inside of the housing can be operatively connected, i.e., connected to a pre-chamber which contains a gaseous medium under a pressure in particular of 1 to 3 bar, in particular a halogen, argon, neon and/or air gas mixture. In this manner, the fluid can be charged with pressure easily and permanently, so that even at higher temperatures of the light-emitting chip crystal, no air bubbles form on the surfaces thereof.

An object of the present invention is to construct a light-emitting element of the abovementioned type such that a higher emission output and/or a greater efficiency in respect of the emission can be achieved.

Another object of the present invention is to provide an inert material, preferably a liquid fluid, which is in direct contact with the light-emitting chip crystal.

BRIEF DESCRIPTION OF THE DRAWINGS

Embodiments of the invention are described in more detail hereinafter with the aid of the drawings, in which.

DETAILED DESCRIPTION OF THE PRESENT INVENTION

Figure 1:
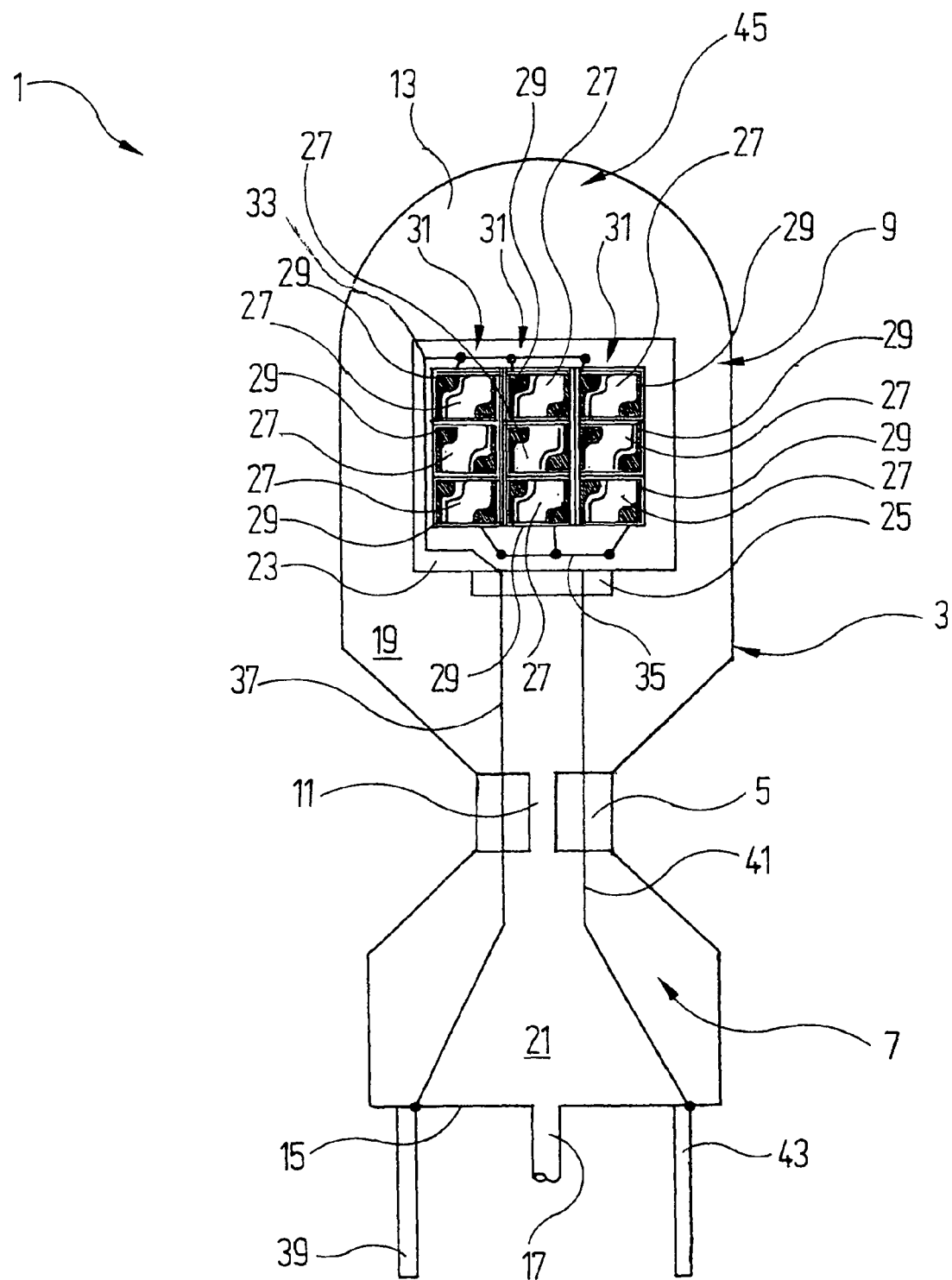
FIG. 1 shows a diagram of a lateral section of a first embodiment example of a light-emitting diode having a planar arrangement of a large number of InGaN/GaN crystal structures in which the InGaN/GaN crystal structures are arranged in three chains connected in parallel each with three InGaN/GaN crystal structures connected in series in a glass housing filled with silicone oil, the arrangement of the InGaN/GaN crystal structures being shown in plan view on a magnified scale compared with the remainder of the light-emitting diode.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

A light-emitting diode given overall the reference symbol 1 is shown in FIG. 1. The light-emitting diode 1 has a hollow cylindrical housing 3 of glass which is transparent to light, the axis thereof running vertically in FIG. 1.

The housing 3 is divided via a horizontal dividing wall 5 in a narrowing of the housing 3 into a pre-chamber 7, at the bottom in FIG. 1, and a main chamber 9, at the top in FIG. 1.

Centrally in the dividing wall 5 is a through-channel 11 running vertically, via which the pre-chamber 7 is connected to the main chamber 9.

The upper face of the housing 3 is spherical, convex in shape when viewed from above, and thus forms an optical glass lens 13. The lower face 15 of the housing 3 is flat.

A glass tube 17 leads into the pre-chamber 7 from the bottom through the lower face 15, through which tube the main chamber 9 is filled with silicone oil 19 and the pre-chamber 7 is filled with a halogen gas mixture 21, explained in more detail below, under pressure during production of the light-emitting diode 1.

A metal support 25 comprising a metal plate 23 is fixed inside the main chamber 9. Nine InGaN/GaN crystal structures 27 each on a sapphire substrate 29 are arranged on the metal plate 23.

The metal plate 23 acts as a reflector for the light emitted by the InGaN/GaN crystal structures 27.

Each InGaN/GaN crystal structure 27 has surface dimensions of between 350 μm×350 μm and 1,050 μm×1,050 μm.

For better illustration of their structure, in FIG. 1 the InGaN/GaN crystal structures 27 on the sapphire substrates 29 are shown in a different perspective, namely in plan view, to the remainder of the light-emitting diode 1, which is shown in lateral section. Furthermore, they are shown magnified compared with the remainder of the light-emitting diode 1.

The InGaN/GaN crystal structures 27 are arranged in three chains 31 running vertically in FIG. 1 and each having three InGaN/GaN crystal structures 27 connected in series. The three chains 31 are connected at their ends via an upper lead 33 and a lower lead 35 at the top and bottom respectively in FIG. 1, so that the chains 31 are connected in parallel.

The upper lead 33 leads to a left-hand connection lead 37 which leads downwards through the main chamber 9, the dividing wall 5, the pre-chamber 7 and the lower face 15 of the pre-chamber 7. It is connected to a left-hand connection pin 39 which projects out of the housing 3 at the bottom in FIG. 1. The left-hand connection pin 39 can be connected to a voltage supply device, not shown, for the light-emitting diode 1.

The lower lead 35 leads anlogously to the upper lead 37 via a right-hand connection lead 41 to a right-hand connection pin 43.

The main chamber 9 is filled completely with transparent silicone oil 19, with which it is filled via the glass tube 17 during production of the light-emitting diode 1. The InGaN/GaN crystal structures 27 with the sapphire substrates 29 are completely immersed in the silicone oil 19. All the free surfaces of the InGaN/GaN crystal structures 27 are thus in direct and bubble-free contact with the silicone oil 19. The free surfaces of the sapphire substrates 29 are also covered with silicone oil 19.

The silicone oil 19 is a good heat conductor. The InGaN/GaN crystal structures 27 and the sapphire substrates 29 are cooled and the heat from these is removed to the outside at the inner surfaces of the housing 3 with the silicone oil 19, so that the InGaN/GaN crystal structures 27 and the silicone oil 19 are not overheated at the surfaces in particular of the InGaN/GaN crystal structures 27.

The glass lens 13 and the silicone oil 19 in the region between the InGaN/GaN crystal structures 27 and the glass lens 13 form an optical system 45, with which the light generated with the InGaN/GaN crystal structures 27 is scattered.

Furthermore, the silicone oil 19 is a good voltage and air insulator, so that it insulates the InGaN/GaN crystal structures 27 and the sapphire substrates 29 electrically and chemically from the environment.

The silicone oil 19 moreover is viscous and thus protects the InGaN/GaN crystal structures 27 and the sapphire substrates 29 against mechanical influences, for example it damps vibrations. It retains its viscosity even at higher temperatures, so that the light-emitting diode 1, in particular the InGaN/GaN crystal structures 27, including during operation, when they are heated up, is protected well.

In the pre-chamber 7 is the halogen gas mixture 21 under a pressure of from 1 to 3 bar. The silicone oil 19 is thus also charged with pressure via the channel 11.

To operate the light-emitting diode 1, a supply voltage suitable for generating the desired brightness is applied to the connection pins 39 and 43.

Known InGaN/GaN crystal structures on sapphire substrates currently operate without the use of silicone oil at a minimum supply voltage of from 3.02 V to not more than 3.2 V and emit blue light in the wavelength range of from 460 nm to 480 nm. If the InGaN/GaN crystal structures on sapphire substrates are cast in transparent resin, as is currently conventional, they can be loaded with a maximum of 5.8 V to 6.5 V and emit blue light having a wavelength of from below 460 nm to 475 nm. At this voltage the transparent resin starts to melt, discolours to yellow with the formation of air bubbles and "dies".

The conduction of heat by the silicone oil 19 in the proposed light-emitting diode 1 has the effect that the InGaN/GaN crystal structures 27, in contrast to the known crystal structures surrounded by transparent resin, can be loaded here with supply voltages of up to 28 V, although according to the manufacturer the same InGaN/GaN crystal structures currently "die" with an incorrect polarity tracking of from 5 to 6 V in known light-emitting diodes.

Although the InGaN/GaN crystal structures 27 are designed solely for a supply voltage of from 5 V to 6 V, when these are immersed according to the invention in silicone oil 19 they withstand a supply voltage of more than 25 V without, for example, burning.

Due to the fact that the silicone oil 19 is charged with a pressure in the light-emitting diode 1 proposed, no air bubbles form even at about 28 V and the InGaN/GaN crystal structures 27 themselves can still be operated at such a high supply voltage. The light yield at this supply voltage in the range of from 3 V to 18 V, which is also above the conventional supply voltage, is very high.

Only from 18 V do the InGaN/GaN crystal structures 27 take up more current without generating more light. A longer operating time of the InGaN/GaN crystal structures 27 which are immerse in transparent silicone oil 19 and emit a very good light intensity is thus possible with a preferred supply voltage of between 3 V and 18 V.

The abovementioned voltage values are given merely by way of example for the InGaN/GaN crystal structures 27 used, and other supply voltages may be necessary for other crystal structures. However, it is essential for the invention that by using the silicone oil 19 or another suitable inert liquid, light-emitting chip crystals used instead of the InGaN/GaN crystal structures 27 can also be operated at higher voltages and/or with higher efficiencies in respect of the light yield than is possible with currently known sheathings, for example with transparent resin.

In order to generate white light, phosphorus crystals or other crystals which are active at wavelengths of from 450 nm to 480 nm and with which blue is converted into white or yellow-white or red or green light are added to the silicone oil 19.

Figure 2:
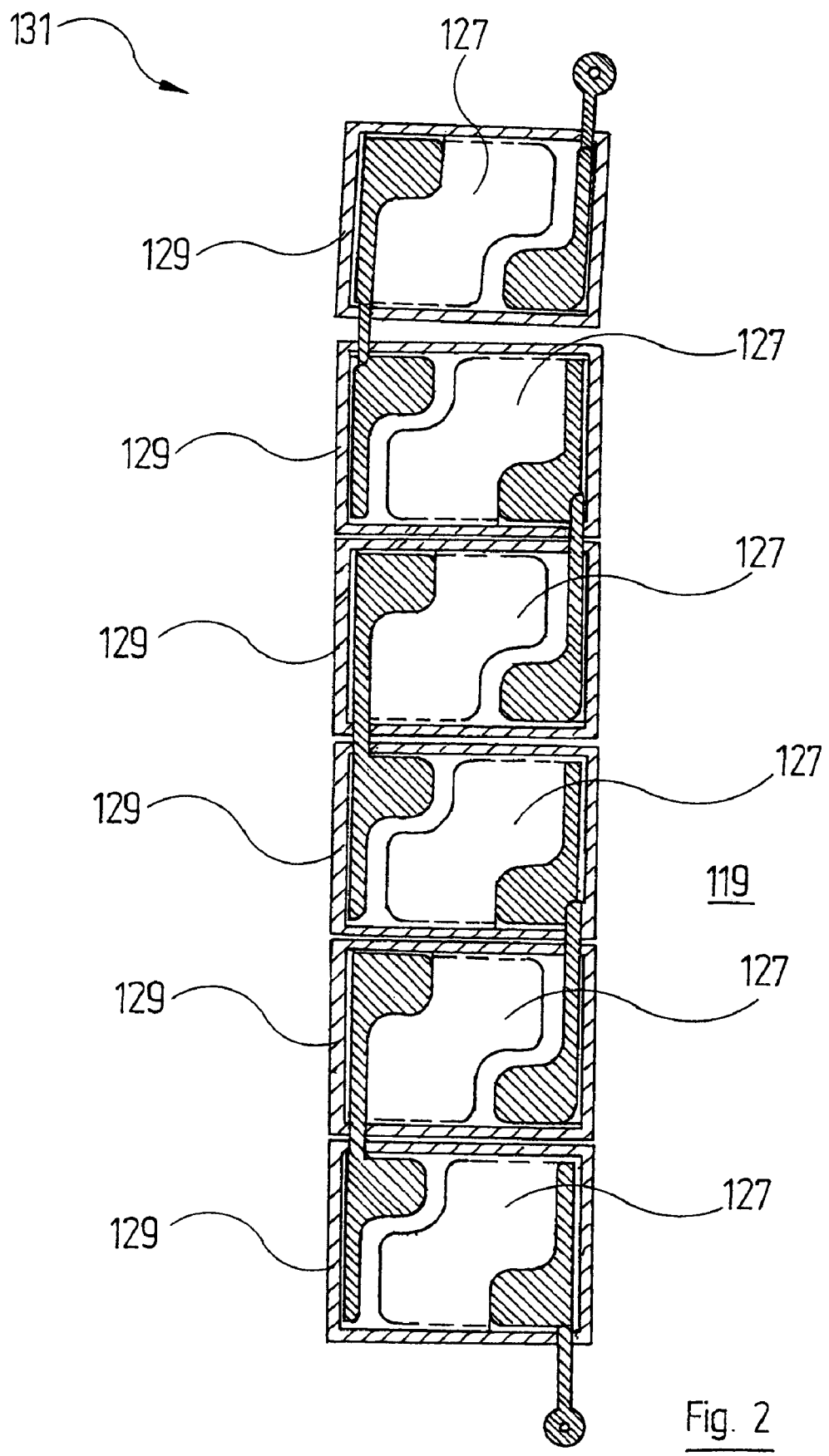
FIG. 2 shows in detail a chain similar to the chains from FIG. 1, comprising six InGaN/GaN crystal structures connected in series.

FIG. 2 shows in detail a chain 131 similar to the chains 31 from FIG. 1 comprising six InGaN/GaN crystal structures 127 connected in series on sapphire substrates 129, which are immersed in silicon oil 119.

Figure 3:
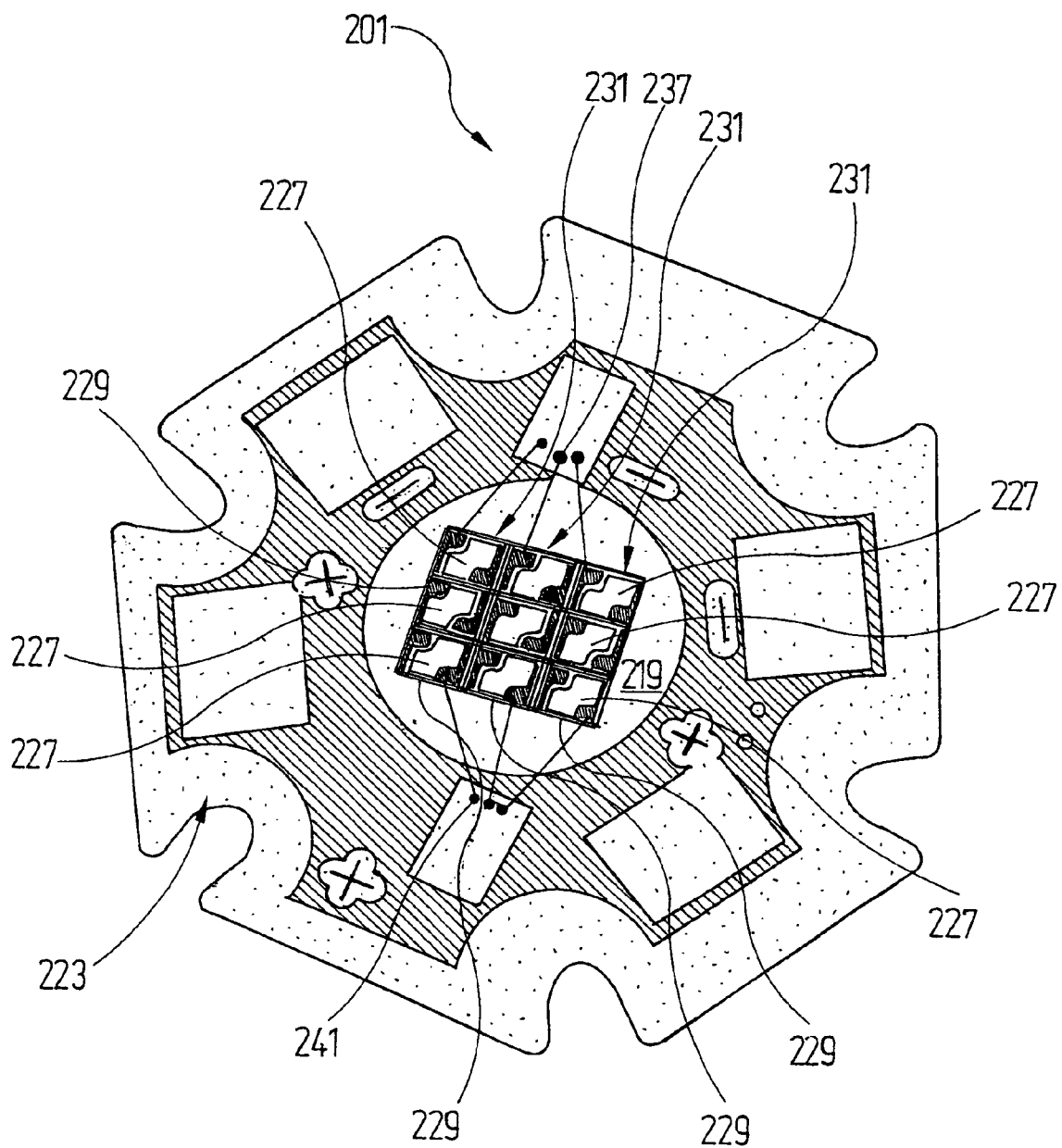
FIG. 3 shows in plan view a metal support plate with InGaN/GaN crystal structures, similar to the InGaN/GaN crystal structures from FIG. 1, of a light-emitting diode similar to the light-emitting diode from FIG. 1.

FIG. 3 shows in plan view a metal support plate 223 with InGaN/GaN crystal structures 227, similar to the InGaN/GaN crystal structures 27 from FIG. 1, of a light-emitting diode 201 similar to the light-emitting diode 1 from FIG. 1. Those elements which are similar to those described in connection with FIG. 1 are provided with the same reference symbols plus 200, so that the statements there are referred to in respect of their description.

Figure 4:
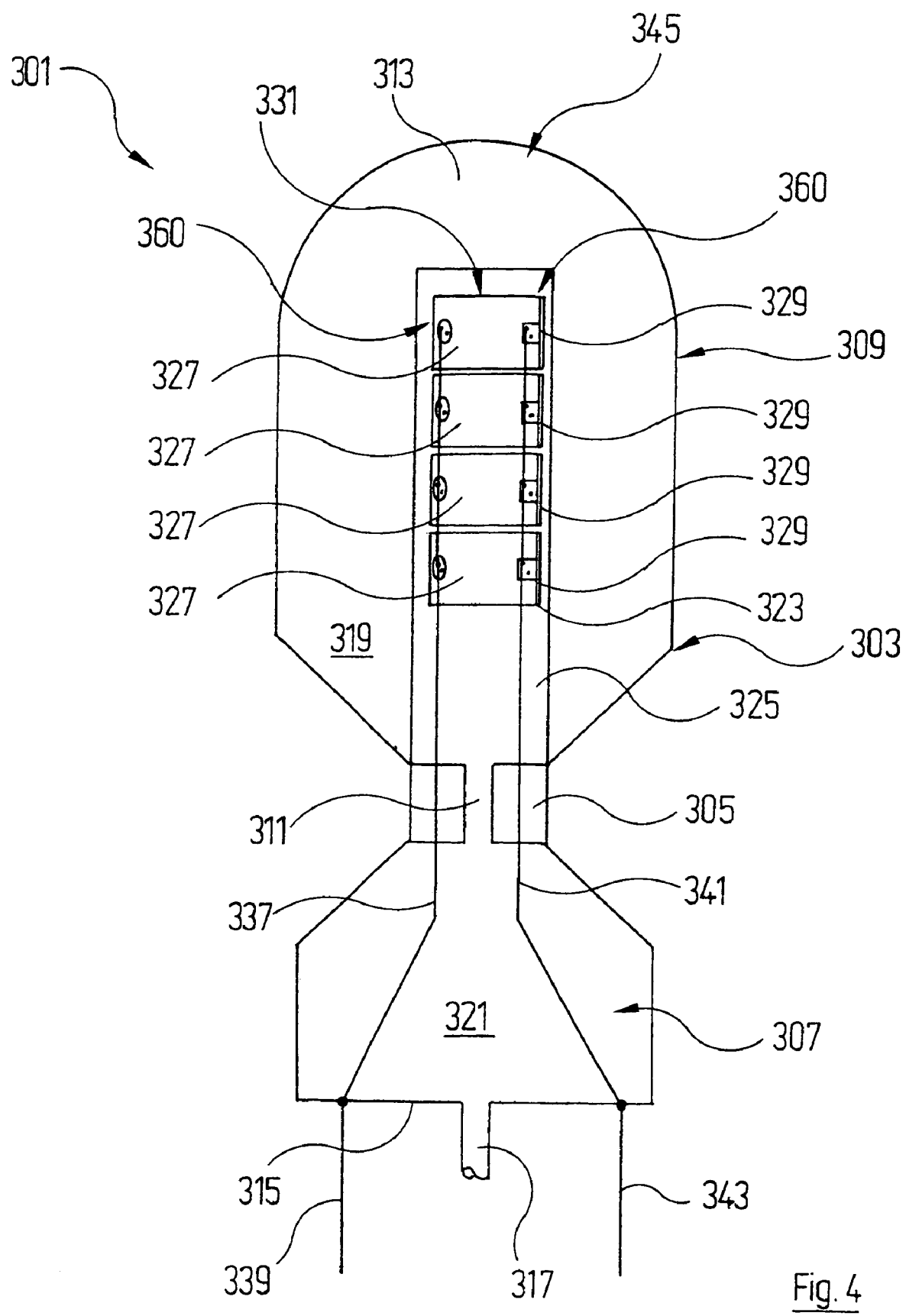
FIG. 4 shows a diagram of a second embodiment of a light-emitting diode similar to that shown in FIG. 1, in which the InGaN/GaN crystal structures are arranged in a hybrid structure comprising four InGaN/GaN crystal structures connected in parallel, the hybrid structure being shown in plan view and on a magnified scale compared with the remainder of the light-emitting diode.

In a further embodiment example of a light-emitting diode 310, shown in FIG. 4, those elements which are similar to those of the first embodiment example described in FIG. 1 are provided with the same reference symbols plus 300, so that the statements relating to the first embodiment example are referred to in respect of their description.

This embodiment example differs from the first in that the light-emitting diode 301 is constructed as a hybrid structure 360 of a plurality of InGaN/GaN crystal structures 327 arranged in a chain 331. The InGaN/GaN crystal structures 327 are connected in series.

Figure 5:
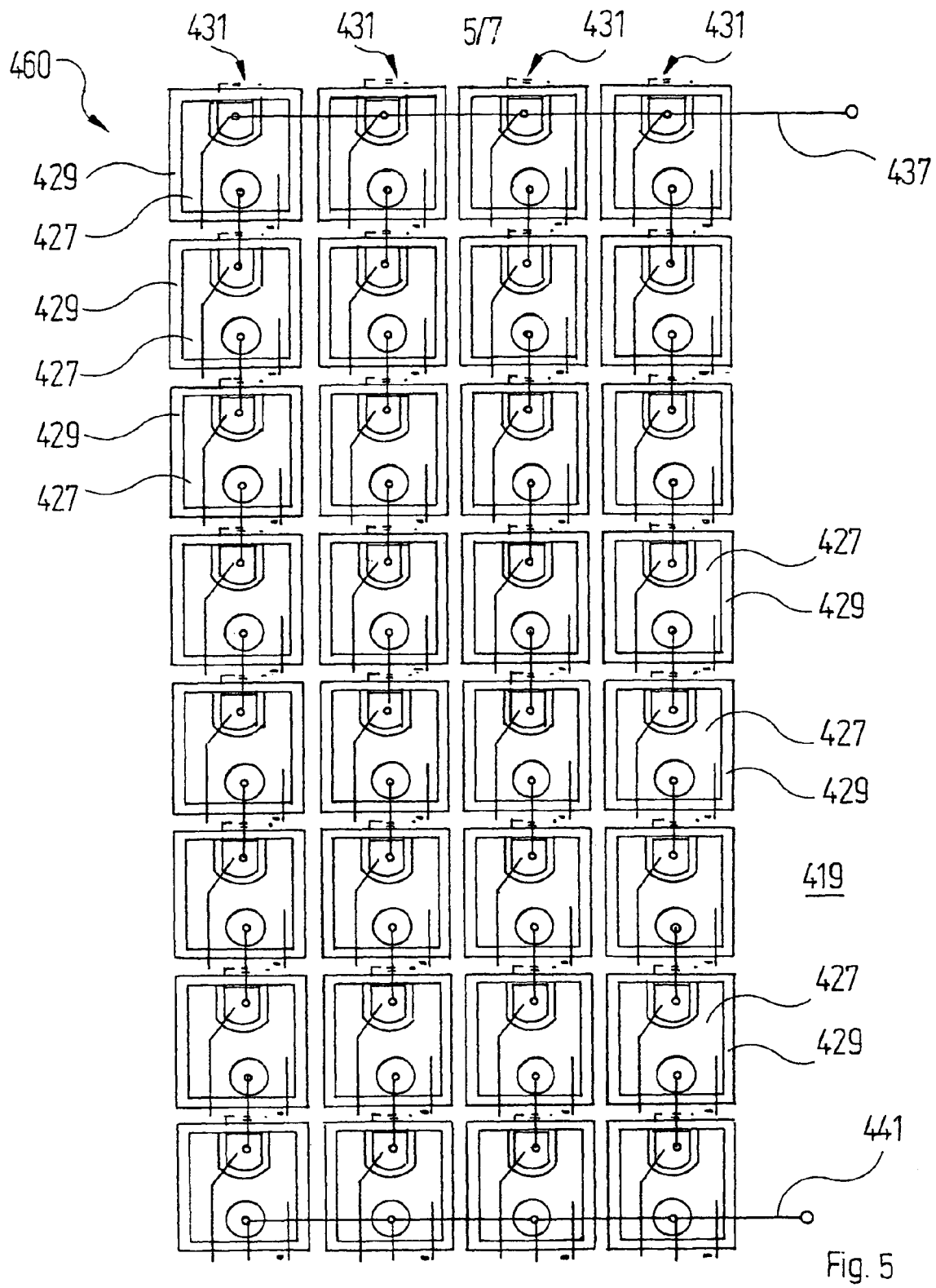
FIG. 5 shows in detail a hybrid structure similar to the hybrid structure from FIG. 4, four chains here, which comprise eight InGaN/GaN crystal structures connected in series, being connected in parallel.

FIG. 5 shows in detail a hybrid structure 460 similar to the hybrid structure 360 from FIG. 4, four chains 431 comprising eight InGaN/GaN crystal structures 427 connected in series on sapphire substrates 429 being connected in parallel and being immersed in silicone oil 419.

Figure 6:
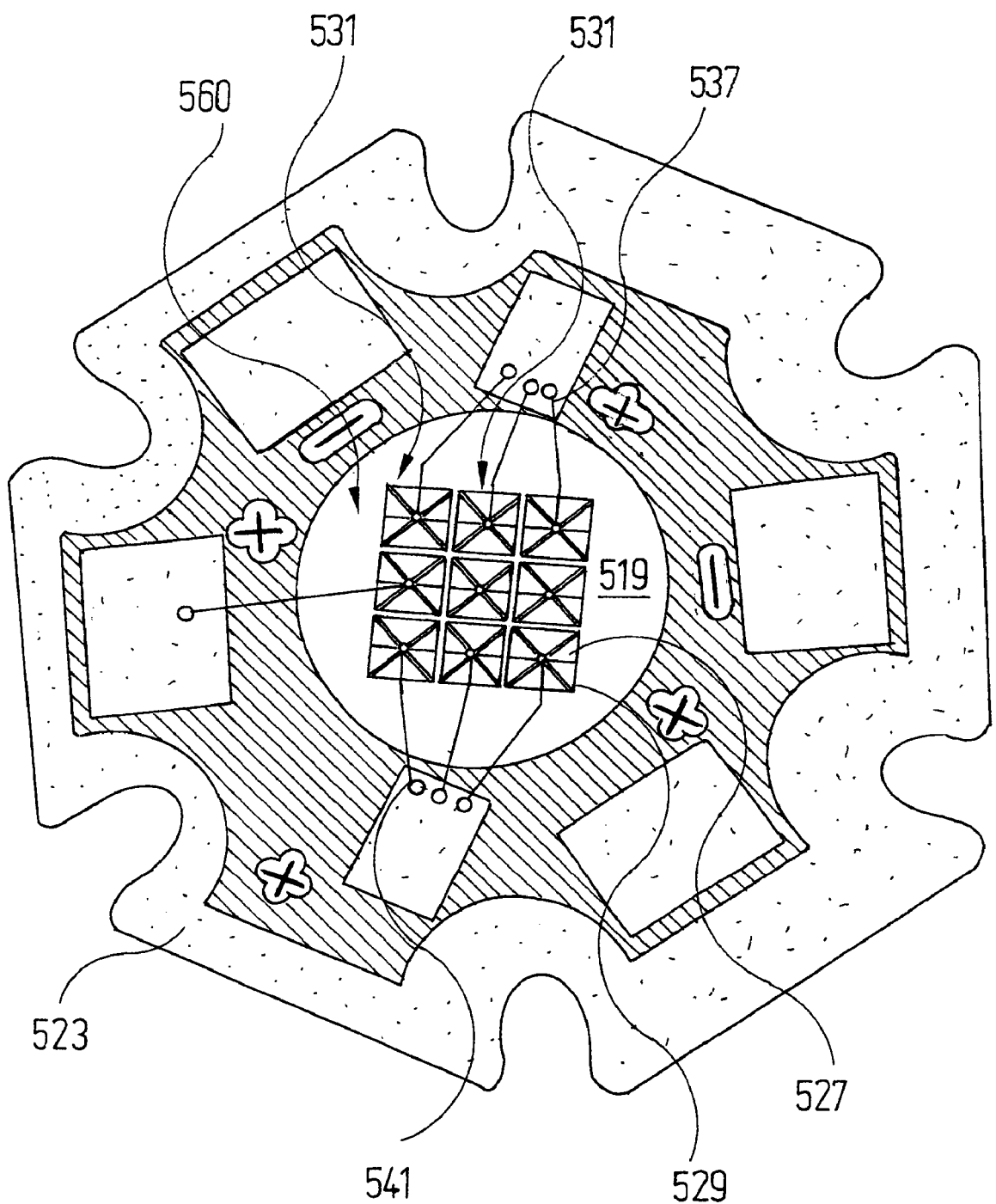
FIG. 6 shows in plan view a metal support plate having a hybrid structure, similar to the hybrid structure from FIG. 4, of a light-emitting diode similar to the light-emitting diode from FIG. 4, the hybrid structure here comprising three chains connected in parallel each having three InGaN/GaN crystal structures connected in series; and, FIG. 7 shows a true-to-scale side view of a light-emitting diode similar to the light-emitting diode from FIG. 1.

FIG. 6 shows in plan view a metal support plate 523, having a hybrid structure 560 similar to the hybrid structure 460 from FIG. 4, of a light-emitting diode similar to the light-emitting diode 301 from FIG. 4. The hybrid structure 560 is immersed in silicone oil 519. It comprises here three chains 531 connected in parallel, each having three InGaN/GaN crystal structures 527 connected in series on sapphire substrates 529. Connection leads 541 and 537 lead from the hybrid structure 560 to connection pins, not shown, of the light-emitting diode.

Figure 7:
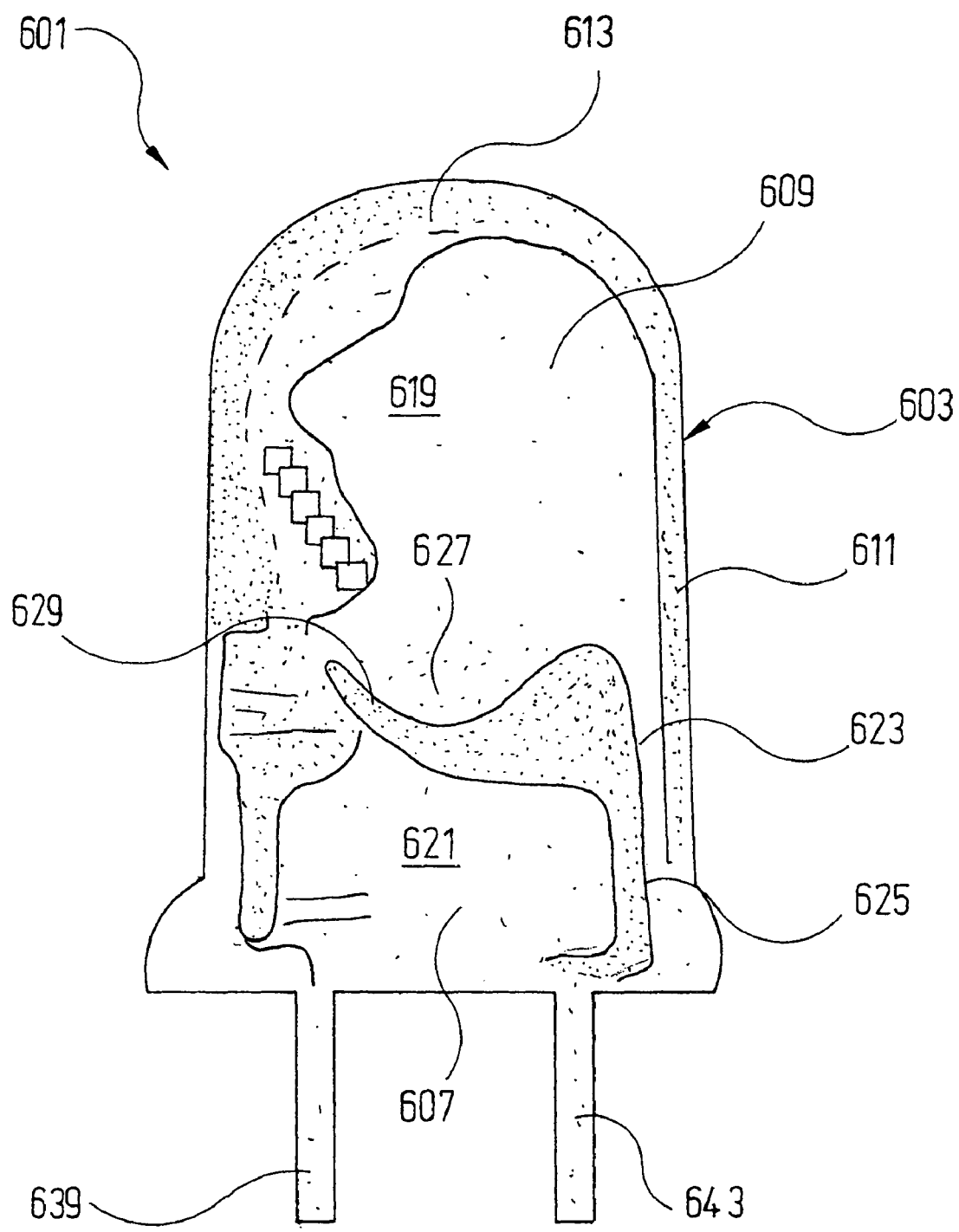

FIG. 7 shows a true-to-scale side view of a light-emitting diode 601 similar to the light-emitting diode 1 from FIG. 1. Those elements which are similar to those described in connection with FIG. 1 are provided with the same reference symbols plus 600, so that the statements there are referred to in respect of their description.

The light-emitting diode 601 has no narrowing between the pre-chamber 607 and the main chamber 609. The channel 611 leads here in an edge region of the housing 603, on the right in FIG. 7, from the bottom to the upper face of the light-emitting diode 601.

Instead of the light-emitting diode 1; 301, another type of light-emitting element can also be realized.

Instead of a plurality of InGaN/GaN crystal structures 27; 127; 227; 327; 427; 527; 627, the light-emitting diode 1; 301 or the light-emitting element can also have only a single crystal structure.

Instead of the InGaN/GaN crystal structures 27; 127; 227; 327; 427; 527; 627, other types of light-emitting chip crystals, in particular semiconductor crystals, for example crystal structures which emit infra-red radiation, which in particular emit at a wavelength of 850 nm, can also be employed.

The InGaN/GaN crystal structures 27; 127; 227; 327; 427; 527; 627 with the sapphire substrates 29; 129; 229; 329; 429; 529; 629 do not have to be immersed completely in the silicone oil 19; 119; 219; 319; 419; 519; 619. It is also possible for only the free surfaces of the InGaN/GaN crystal structures 27; 127; 227; 327; 427; 527; 627 to be covered with the silicone oil 19; 119; 219; 319; 419; 519; 619.

Instead of the silicone oil 19; 119; 219; 319; 419; 519; 619, another inert liquid fluid can also be used.

The liquid fluid, in particular the silicone oil 19; 119; 219; 319; 419; 519; 619, can also be thinly liquid instead of viscous.

A liquid fluid which changes its viscosity at higher temperatures can also be used.

Moreover, the silicone oil 19; 119; 219; 319; 419; 519; 619 can also be transparent only to the light of the wavelength range emitted by the light-emitting chip crystal.

The liquid fluid, in particular the silicone oil 19; 119; 219; 319; 419; 519; 619, does not have to be charged with a pressure, and it can also have the ambient pressure.

The liquid fluid, in particular the silicone oil 19; 119; 219; 319; 419; 519; 619, can also contain, instead of the phosphorus crystals, other media, the light of which is extracted, which influence the wavelength emitted or the wavelength range, in particular crystals, or no additives at all. If the silicone oil 19; 119; 219; 319; 419; 519; 619 contains no additives, the InGaN/GaN crystal structures 27; 127; 227; 327; 427; 527; 627 emit blue light in the wavelength range of between 460 nm and 475 nm.

The light-emitting chip crystal, in particular the InGaN/GaN crystal structures 27; 127; 227; 327; 427; 527; 627, can also be arranged on another type of substrate, preferably a substrate of diamond, instead of on a sapphire substrate 29; 129; 229; 329; 429; 529; 629. Smaller light-emitting chip crystals having dimensions of in particular 300 µm×300 µm can also be realized by this means.

Instead of the metal support 25; 325; 625, a ceramic support can also be employed for the light-emitting chip crystal or the substrate. The metal support 25; 325; 625 can also be constructed in another form instead of as a plate 23; 223; 323; 523; 623.

The silicone oil 19; 119; 219; 319; 419; 519; 619 does not necessarily have to be arranged such that it has the effect of an optical system.

Instead of only the one glass lens 13; 313, a lens arrangement or even no lens at all can also be provided. Instead of the glass lens 13; 313, a lens of another material, for example of plastic, can also be used. The lens can also be inverted over the light-emitting chip crystals, which are arranged, for example, on a support plate. The lens thus acts as a housing and the region between the lens and the light-emitting chip crystals can be filled with the liquid fluid.

The light-emitting chip crystals, in particular the individual InGaN/GaN crystal structures 27; 127; 227; 327; 427; 527; 627, can also have surface dimensions which are smaller than 350 µm×350 µm or larger than 1,050 µm×1,050 µm.

The InGaN/GaN crystal structures 27; 127; 227; 327; 427; 527; 627 with the sapphire substrates 29; 129; 229; 329; 429; 529; 629 on the metal plate 23; 223; 323; 523; 623 of the metal support 25; 325; 625 can also be arranged in another type and/or another form of housing, for example a housing of plastic, instead of in the housing 3; 303; 603 of glass. The housing 3; 303; 603 can also enclose only the InGaN/GaN crystal structures 27; 127; 227; 327; 427; 527; 627 with the liquid fluid.

The housing 3; 303; 603 can also be transparent only to light of the wavelength range emitted by the InGaN/GaN crystal structures 27; 127; 227; 327; 427; 527; 627.

Instead of the glass tube 17; 317, the housing 3; 303 can also comprise another type of means for filling with the liquid fluid, in particular the silicone oil 19; 19; 219; 319; 419; 519;

619, and/or the halogen gas mixture 21; 321; 621 or another gas mixture, for example a hose of plastic or merely an opening, also at another place on the housing 3; 303; 603. Different means for filling can also be provided for the liquid fluid and the gas mixture.

Instead of only one channel 11; 211; 311; 511; 611, several channels can also connect the pre-chamber 7; 307; 607 to the inside of the housing 3; 303; 603.

Instead of the halogen gas mixture 21; 321; 621, another type of gaseous medium under pressure, for example an argon, neon and/or air gas mixture, can also be in the pre-chamber 7; 307; 607. The pressure can also be less than 1 bar or greater than 3 bar.

It should be emphasized that the above-described embodiments of the present invention, particularly, any "preferred" embodiments, are possible examples of implementations merely set forth for a clear understanding of the principles of the invention. Many variations and modifications may be made to the above-described embodiments of the invention without substantially departing from the spirit and principles of the invention. All such modifications are intended to be included herein within the scope of this disclosure and the present invention, and protected by the following claims.

The invention claimed is:

1. A light-emitting element comprising:
   at least one light-emitting chip crystal; and,
   an inert material including a liquid which is in contact with at least one free surface of the light-emitting chip crystal, wherein
   the at least one light-emitting chip crystal is arranged in a housing filled with the liquid, and an inside of the housing is operatively connected via a through-channel to a pre-chamber in which a gaseous medium is permanently provided under a pressure.

2. The light emitting element according to claim 1, wherein the at least one light-emitting chip crystal is a semiconductor crystal.

3. The light emitting element according to claim 1, wherein the liquid is transparent at least to light of a wavelength range emitted by the at least one light-emitting chip crystal.

4. The light-emitting element according to claim 1, wherein the liquid is an electric insulator and/or air insulator.

5. The light-emitting element according to claim 1, wherein the liquid is viscous.

6. The light-emitting element according to claim 1, wherein the liquid retains its viscosity at higher temperatures.

7. The light-emitting element according to one claim 1, wherein the liquid is a heat conductor.

8. The light-emitting element according to claim 1, wherein the liquid is charged with a pressure.

9. The light-emitting element according to claim 1, wherein the liquid is silicone oil.

10. The light-emitting element according to claim 1, wherein the at least one light-emitting chip crystal is a structure of InGaN/GaN.

11. The light-emitting element according to claim 1, wherein the liquid includes a media which influence the wavelength emitted or the wavelength range.

12. The light-emitting element according to claim 11, wherein the media includes dyestuffs and/or phosphorous crystals.

13. The light-emitting element according to claim 1, wherein the at least one light-emitting chip crystal is a structure of crystals which emit infra-red radiation.

14. The light-emitting element according to claim 1, wherein the at least one light-emitting chip crystal is arranged on a substrate.

15. The light-emitting element according to claim 14, wherein the substrate includes sapphire and/or diamond.

16. The light-emitting element according to claim 14, further including a support for the at least one light-emitting chip crystal or the substrate.

17. The light-emitting element according to claim 16, wherein the support includes metal and/or ceramic.

18. The light-emitting element according to claim 16, wherein the support comprising a plate capable of reflecting the light emitted by the at least one light-emitting chip crystal.

19. The light-emitting element according to claim 1, wherein the liquid is operatively configured proximate the at least one light-emitting chip crystal to effect an optical system for the light emitted by the light-emitting chip crystal.

20. The light-emitting element according to claim 19, wherein the optical system is a lens.

21. The light-emitting element according to claim 1, wherein at least the at least one light-emitting chip crystal is covered by an optical lens, and at least the region between the at least one light-emitting chip crystal and the optical lens is filled with the liquid.

22. The light-emitting element according to claim 21, wherein the optical lens is a glass lens.

23. The light-emitting element according to claim 1, wherein the at least one light-emitting chip crystal, includes a range of surface dimensions between 350 gm×350 gm and 1,050 gm×1,050 µm.

24. The light-emitting element according to claim 1, further comprising a hybrid structure of a plurality of light-emitting chip crystals which are arranged in chains and connected in series.

25. The light-emitting element according to claim 1, wherein the housing is transparent to light of the wavelength range emitted by the at least one light emitting chip crystal.

26. The light-emitting element according to claim 1, wherein the housing is transparent and includes glass and/or plastic.

27. The light-emitting element according to claim 1, wherein the housing comprises a means for filling it with the liquid.

28. The light-emitting element according to claim 1, wherein the pressure is in a range of substantially 1 to substantially 3 bar.

29. The light-emitting element according to claim 1, wherein the gaseous medium includes halogen, argon, neon, air, and/or a combination thereof.

30. The light-emitting element according to claim 29, wherein the pressure is in a range of substantially 1 to substantially 3 bar.

* * * * *

UNITED STATES PATENT AND TRADEMARK OFFICE
CERTIFICATE OF CORRECTION

| | | |
|---|---|---|
| PATENT NO. | : 7,851,815 B2 | Page 1 of 1 |
| APPLICATION NO. | : 11/584350 | |
| DATED | : December 14, 2010 | |
| INVENTOR(S) | : Diamantidis | |

It is certified that error appears in the above-identified patent and that said Letters Patent is hereby corrected as shown below:

Claim 23, Column 10, Lines 35-36    Replace "gm" with "μm" – 350 [[gm]]μm x 350[[gm]]μm and 1,050[[gm]]μm x 1,050μm Signed and Sealed this
Fifteenth Day of February, 2011

David J. Kappos
*Director of the United States Patent and Trademark Office*